(12) United States Patent
Ikuta et al.

(10) Patent No.: US 6,207,341 B1
(45) Date of Patent: *Mar. 27, 2001

(54) METHOD FOR PRODUCING A CHEMICALLY ADSORBED FILM

(75) Inventors: Shigeo Ikuta, Katano; Kazufumi Ogawa, Nara; Mamoru Soga, Ikoma, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/093,255

(22) Filed: Jun. 8, 1998

Related U.S. Application Data

(63) Continuation of application No. 08/556,015, filed on Nov. 9, 1995.

(30) Foreign Application Priority Data

Nov. 14, 1994 (JP) .................................................. 6-279122
Oct. 3, 1995 (JP) .................................................. 7-255979

(51) Int. Cl.$^7$ ................................. G03F 7/20; G03F 7/26
(52) U.S. Cl. .......................... 430/269; 430/945; 427/553; 427/554; 427/555
(58) Field of Search .................................. 430/269, 945; 427/553, 554, 555

(56) References Cited

U.S. PATENT DOCUMENTS

| | | | |
|---|---|---|---|
| 3,535,145 | 10/1970 | Gowdy et al. | 117/69 |
| 3,619,246 | 11/1971 | Bragole | 117/47 A |
| 3,849,166 | 11/1974 | Omichi et al. | 117/47 A |
| 4,568,632 | 2/1986 | Blum et al. | 430/322 |
| 4,810,601 | 3/1989 | Allen et al. | 430/18 |
| 5,139,925 | 8/1992 | Hartney | 430/326 |
| 5,324,543 | 6/1994 | Ogawa et al. | 427/387 |
| 5,372,888 | 12/1994 | Ogawa et al. | 428/422 |
| 5,500,250 | 3/1996 | Ogawa et al. | 427/299 |

FOREIGN PATENT DOCUMENTS

| | | | |
|---|---|---|---|
| 516087 | 3/1993 | (JP) | G11B/5/84 |
| 6200074 | 7/1994 | (JP) | C08K/9/04 |

*Primary Examiner*—Cynthia Hamilton
(74) *Attorney, Agent, or Firm*—Renner, Otto, Boisselle & Sklar

(57) ABSTRACT

According to the present invention, a method for producing a chemically adsorbed film is provided. The method includes the steps of: irradiating a surface of a polymer substrate with ultraviolet laser light so as to produce a hydrophilic group on the surface of the polymer substrate; and contacting a chemical adsorption solution containing a chlorosilane-based chemical adsorbent and a nonaqueous solvent and the polymer substrate on which the hydrophilic group is produced; and reacting the hydrophilic group of the polymer substrate with a chlorosilyl group of the chlorosilane-based chemical adsorbent for forming a covalent bond, thereby forming a chemically adsorbed film on the surface of the polymer substrate.

5 Claims, 4 Drawing Sheets

METHOD FOR PRODUCING A CHEMICALLY ADSORBED FILM

This application is a continuation of Ser. No. 08/556,015, filed Nov. 9, 1995.

BACKGROUND OF THE INVENTION

1. Field of the Invention

The present invention relates to a method for producing a chemically adsorbed film. More specifically, the present invention relates to a method for producing a chemically adsorbed film which may be provided as a monomolecular film on the surface of a polymer substrate and is useful in modifying the surface of the substrate.

2. Description of the Related Art

A conventional method for producing a chemically adsorbed film is disclosed, for example, in Japanese Patent Publication No. 5-16087. According to the method disclosed in the patent publication, a chemically adsorbed film is formed on the surface of a substrate by allowing hydrophilic groups such as hydroxyl groups on the surface of a substrate to react with a chlorosilane surfactant. In the case of using a substrate where a large number of hydrophilic groups such as hydroxyl groups do not exist on the surface of a substrate, the following method is known from Japanese Laid-Open Patent Publication No. 6-200074. For example, the surface of the substrate is oxidized so as to be hydrophilic; and then a chlorosilane surfactant is chemically adsorbed onto the surface by performing an oxygen plasma treatment, a corona treatment, a UV light irradiation using a low-pressure mercury lamp, an immersion of the substrate in a chromic acid mixture (a mixed solution of concentrated sulfuric acid and potassium bichromate), or the like.

According to these conventional methods, however, even when oxidization is performed, satisfactory effects cannot be obtained, and a sufficient amount of hydrophilic groups (e.g., hydroxyl groups) required for reacting with a chlorosilane surfactant cannot be produced on the surface of a substrate. As a result, a chemically adsorbed film cannot be formed on the surface of the substrate at all, and even if the film can be formed, a high-density chemically adsorbed film cannot be obtained because there are many pin holes in the resulting film. Therefore, neither a chemically adsorbed film having satisfactory properties, e.g., water repellency, oil repellency, anti-contaminating property, antistatic property and the like, nor a chemically adsorbed film having practical durability can be obtained.

In addition, according to the above-described methods, since a desired part of the surface of the substrate cannot be selectively oxidized, it is impossible to obtain a chemically adsorbed film on which desired fine patterns are formed.

Therefore, a method for producing a high-density chemically adsorbed film and a method for producing a chemically adsorbed film having desired fine patterns thereon are required to be developed.

SUMMARY OF THE INVENTION

According to the present invention, a method for producing a chemically adsorbed film is provided. The method includes the steps of: irradiating a surface of a polymer substrate with ultraviolet laser light so as to produce a hydrophilic group on the surface of the polymer substrate; and contacting a chemical adsorption solution containing a chlorosilane-based chemical adsorbent and a nonaqueous solvent and the polymer substrate on which the hydrophilic group is produced; and reacting the hydrophilic group of the polymer substrate with a chlorosilyl group of the chlorosilane-based chemical adsorbent for forming a covalent bond, thereby forming a chemically adsorbed film on the surface of the polymer substrate.

In one embodiment, the ultraviolet laser light is selectively irradiated onto a predetermined part of the surface of the polymer substrate.

In another embodiment, the polymer substrate is made of a material selected from the group consisting of: polyimide, polycarbonate, polysulfone, polyethyleneterephthalate, polyetheretherketone, polyarylate, polyethersulfone, and polyetherimide.

In still another embodiment, the ultraviolet laser light is excimer laser light.

In still another embodiment, the chlorosilane-based chemical adsorbent has a fluorocarbon group.

According to another aspect of the present invention, a method for producing a chemically adsorbed film is provided. The method includes the steps of: irradiating a surface of a polymer substrate with ultraviolet light including a wavelength of about 175 nm or less so as to produce a hydrophilic group on the surface of the polymer substrate; and contacting a chemical adsorption solution containing a chlorosilane-based chemical adsorbent and a nonaqueous solvent and the polymer substrate on which the hydrophilic group is produced; and reacting the hydrophilic group of the polymer- substrate with a chlorosilyl group of the chlorosilane-based chemical adsorbent for forming a covalent bond, thereby forming a chemically adsorbed film on the surface of the polymer substrate.

In one embodiment, the ultraviolet light including a wavelength of about 175 nm or less is selectively irradiated onto a predetermined part of the surface of the polymer substrate.

Thus, the invention described herein makes possible the advantages of (1) providing a method for producing a high-density chemically adsorbed film; (2) providing a method for producing a chemically adsorbed film having excellent properties such as water/oil repellencies, anti-contaminating property, and antistatic property; (3) providing a method for producing a chemically adsorbed film having excellent durability; and (4) providing a method for producing a chemically adsorbed film having desired fine patterns thereon.

These and other advantages of the present invention will become apparent to those skilled in the art upon reading and understanding the following detailed description with reference to the accompanying figures.

BRIEF DESCRIPTION OF THE DRAWINGS

FIGS. 1A to 1E are schematic illustrations showing the respective steps of an exemplary method for producing a chemically adsorbed film according to the present invention, in which:

FIG. 1A is a schematic cross-sectional view of a substrate;

FIG. 1B is a schematic illustration showing a step of producing hydrophilic groups on the surface of the substrate;

FIG. 1C is a schematic illustration showing a step of forming a chemically adsorbed film on the surface of the substrate shown in FIG. 1B where the hydrophilic groups are produced;

FIG. 1D is a schematic illustration showing a step of producing an even larger number of hydrophilic groups on the surface of the substrate; and FIG. 1E is a schematic illustration showing a step of forming a chemically adsorbed film on the surface of the substrate shown in FIG. 1D where an even larger number of hydrophilic groups have been produced.

FIGS. 2A to 2C are schematic illustrations showing the respective steps of another exemplary method for producing a chemically adsorbed film according to the present invention, in which:

FIG. 2A is a schematic illustration showing a step of selectively irradiating a desired part of the surface of the substrate with UV light (UV laser and/or uv light including a wavelength of about 175 nm or less);

FIG. 2B is a schematic illustration showing the hydrophilic groups selectively formed in the desired part of the surface of the substrate; and FIG. 2C is a schematic illustration showing the chemically adsorbed film selectively formed in the desired part of the surface of the substrate.

DESCRIPTION OF THE PREFERRED EMBODIMENTS

A preferred method for producing a chemically adsorbed film according to the present invention will be described with reference to FIGS. 1A to 1E.

Figure 1A:
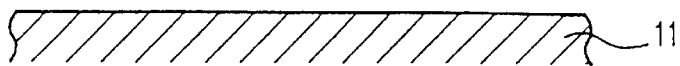

FIG. 1A is a schematic cross-sectional view of a substrate 11. The substrate 11 is made of a polymer material. As the polymer material for the substrate 11, any of known polymer materials widely used can be employed. However, the present invention is directed to polymer resin materials having no hydrophilic groups, in particular. Such polymer materials include polyimide, polycarbonate, polyethyleneterephthalate, polyethersulfone, polyetheretherketone, polyarylate, polysulfone, polyetherimide, and the like. These polymer materials canbe used for the substrate in any desired shapes (for example, film, plate, other complex shapes).

Figure 1B:
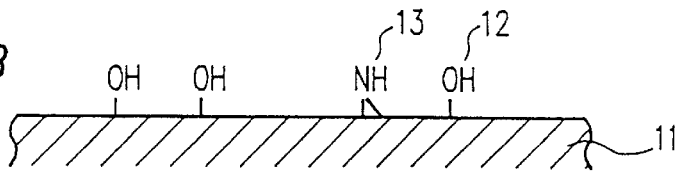

Then, as shown in FIG. 1B, a large number of hydrophilic groups, e.g., OH groups 12 and NH groups 13, are produced on the surface of the substrate 11. The hydrophilic groups are produced by irradiating the surface of the substrate with UV laser or UV light including a wavelength of 175 nm or less. As the UV laser, excimer lasers such as an ArF laser (wavelength: 193 nm), a KrF laser (wavelength: 248 nm), and an XeCl laser (wavelength: 308 nm); gas lasers such as an He-Cd laser (wavelength: 325 nm), an Ar laser (wavelength: 351.1 to 363.8 nm), and an $N_2$ laser (wavelength: 337 nm); or the harmonic wave of a YAG laser (wavelength: 266 nm, for example) can be used. An excimer laser is preferably used, because the excimer laser is a high-output short-pulse laser and therefore excellent both in reactivity and controllability.

As a UV light source for emitting UV light including a wavelength of 175 nm or less, a dielectric barrier discharge lamp is generally used. For example, in the case of the dielectric barrier discharge lamp in which Xe gas is enclose, the central wavelength of the emitted UV light is 172 nm. Since the optical absorption coefficient of oxygen is high at this wavelength, the concentration of resulting ozone and the concentration of excited oxygen atoms become higher and the effects obtained by oxidizing the substrate increase. As a result, a large number of hydrophilic groups are produced on the surface of the substrate.

The conditions for irradiating the UV light (UV laser and/or UV light including a wavelength of 175 nm or less) are variable depending upon the kind of UV light used. For example, in the case of irradiating an excimer laser, the laser is preferably irradiated at an energy density in an approximate range of 0.01 to 10 $J/cm^2$ for every pulse irradiation, and more preferably at an energy density in an approximate range of 0.1 to 1 $J/cm^2$ for every pulse irradiation. By irradiating the UV light at an energy density in such a range, the irradiated part of the substrate is instantaneously decomposed, so that an abrasion occurs. As a result, a large number of hydrophilic groups are produced on the surface of the substrate. For example, in the case of using an Xe gas dielectric barrier discharge lamp, the illuminance of the lamp is preferably in an approximate range of 5 to 100 $mW/cm^2$, and more preferably in an approximate range of 20 to 50 $mW/cm^2$. The irradiation time is preferably in a range of about 5 to about 10 minutes, more preferably in a range of about 6 to about 8 minutes.

Figure 1C:
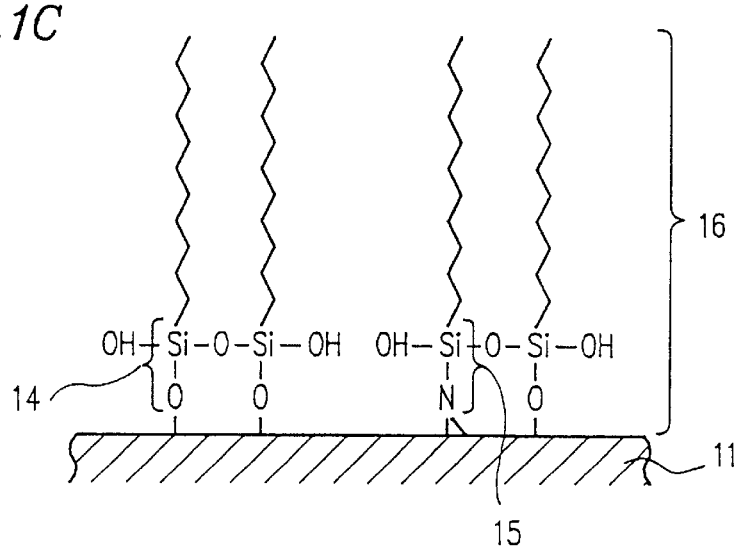

Next, as shown in FIG. 1C, a chemically adsorbed film 16 is formed in the following procedure. (Steps (A) and (B)).

(A) A chemical adsorption solution containing a chlorosilane-based chemical adsorbent and a nonaqueous solvent is made to come into contact with the substrate on which the hydrophilic groups have been produced. As the chlorosilane-based chemical adsorbent contained in the chemical adsorption solution, trichlorosilane-based chemical adsorbent such as $CF_3(CF_2)_7(CH_2)_2SiCl_3$, $CF_3CH_2O$ $(CH_2)_{15}SiCl_3$, $CF_3(CH_2)_2Si(CH_3)_2(CH_2)_{15}SiCl_3$, $CF_3(CF_2)_3 Si(CH_3)_2(CH_2)_9SiCl_3$, $CF_3(CF_2)_7Si(CH_3)_2(CH_2)_8 SiCl_3$, $CF_3 (CF_2)_7Si (CH_3)_2(CH_2)_{10}SiCl_3$, $CF_3COO(CH_2)_{15} SiCl_3$ and $CF_3 (CF_2)_5(CH_2)_2SiCl_3$, and monochlorosilane-based or dichlorosilane-based chemical adsorbent substituted by a lower alkyl group such as $CF_3(CF_2)_7(CH_2)_2 SiCl_n(CH_3)_{3-n}$, $CF_3(CF_2)7(CH_2)_2SiCl_n(C_2H_5)_{3-n}$, $CF_3CH_2O(CH_2)_{15}SiCl_n(CH_3)_{3-n}$, $CF_3CH_2O(CH_2)_{15}SiCl_n (C_2H_5)_{3-n}$, $F_3(CH_2)_2Si(CH_3)_2(CH_2)_{15}SiCl_n(CH_3)_{3-n}$, $CF_3 (CH_2)_2Si(CH_3)_2(CH_2)_{15}SiCl_n(C_2H_5)_{3-n}$, $CF_3(CF_2)_7Si (CH_3)_2)_2 (CH_2)_8SiCl_n(CH_3)_{3-n}$, $CF_3COO(CH_2)_{15}SiCl_n (CH_3)_{3-n}$ and $CF_3(CF_2)_5(CH_2)_2SiCl_n(CH_3)_{3-n}$ (in all the above-cited compounds, n is 1 or 2) can be used. A trichlorosilane-based chemical adsorbent is preferably used, because SiCl bonds, excluding the SiCl bonds forming covalent bonds (e.g., -Si-O- bonds), with a hydrophilic group can further form covalent bonds (e.g., -Si-O- bonds) with adjacent SiCl bonds, and a more solid chemically adsorbed film can be obtained. Among the trichlorosilane-based chemical adsorbents, a compound represented by a formula $CF_3(CF_2)_q(CH_2)_2SiCl_3$ (where q is preferably about 3 to about 25, more preferably about 6 to about 15) is particularly preferred because the compound has an excellent balance among solvent solubility, chemical adsorptiveness and various properties such as water/oil repellencies, and anti-contaminating property.

Any nonaqueous solvent can be used so long as the solvent does not etch the substrate, and does not include active hydrogens reactive with a SiCl group. Such solvents include carbon-containing solvents such as cyclohexane, hexadecane, isooctane, toluene, xylene, tetralin, petroleum ether, chloroform, carbon tetrachloride, perfluorocarbon, perfluoroalkyl tertiary-amine, perfluoroalkyl cyclic ether and the like. The concentration of the chemical adsorption solution is preferably in an approximate range of 0.01 to 10 weight %, more preferably in an approximate range of 0.1 to 5 weight %. As the methods for contacting the chemical adsorption solution and the substrate, the immersion of the substrate in the chemical adsorption solution, spraying and the like can be used. Immersion is preferred. In performing the immersion, the immersion time is preferably in an approximate range of 1 minute to 20 hours, more preferably in an approximate range of 10 minutes to 6 hours.

(B) By contacting the chemical adsorption solution and the substrate in the above-described manner (e.g., by immersion), the hydrophilic groups of the substrate react with the chlorosilyl groups of the chlorosilane-based chemical adsorbent. More specifically, this reaction is a dehydrochloric acid reaction between the OH groups 12, the NH groups 13, etc. shown in FIG. 1B and the SiCl groups. As a result, the covalent bonds such as -Si-O- bonds 14 and -Si-N- bonds 15 shown in FIG. 1C are formed. The chemically adsorbed film 16 is formed in this way.

Figure 1D:
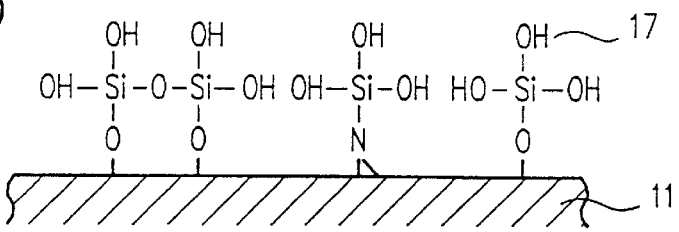

Preferably, the substrate on which the hydrophilic groups are produced is allowed to react with a material including a plurality of SiCl groups in a molecule, and then allowed to react with water. As a result, a larger number of hydrophilic groups can be produced on the surface of the substrate as shown in FIG. 1D. This is because a plurality of hydrophilic groups are produced with respect to one hydrophilic group produced by the UV light (UV laser and/or UV light including a wavelength of 175 nm or less) irradiation. The materials having a plurality of SiCl groups in a molecule include $SiCl_4$, $SiHCl_3$, $Cl$-$(SiCl_2O)_n$-$SiCl_3$ (where n is an integer equal to or larger than 1), $Cl_m(CH_3)_{3-m}Si$-$(CH_2)_p$-$SiCl_m(CH_3)_{3-m}$ (where m is an integer in a range of 1 to 3, and p is an integer equal to or larger than 1). The reaction between the material having a plurality of SiCl groups in a molecule and the hydrophilic groups of the substrate is conducted in the same way as the formation of the chemically adsorbed film mentioned above.

An exemplary reaction using a material having a plurality of SiCl groups in a molecule will be described. A substrate on which hydrophilic groups (e.g., OH groups and NH groups) are produced is immersed in a solution containing 1 weight % of $SiCl_4$ in cyclohexane, for example. As a result, the SiCl bonds of $SiCl_4$ react with the OH groups and the NH groups on the surface of the substrate, so that the bonds represented by following Formula I are formed and a large number of SiCl bonds not reacted with the OH groups or the NH groups come to exist on the surface of the substrate.

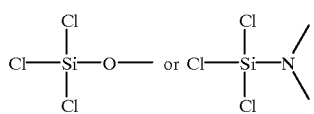

(I)

By allowing the substrate to further react with water, the large number of SiCl bonds existing on the surface of the substrate react with the hydroxyl groups of water, so that the bonds represented by following Formula II are formed.

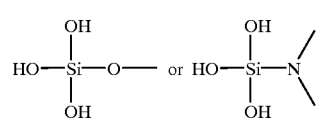

(II)

In this way, an even larger number of OH groups 17 can be produced on the surface of the substrate as shown in FIG. 1D.

Figure 1E:
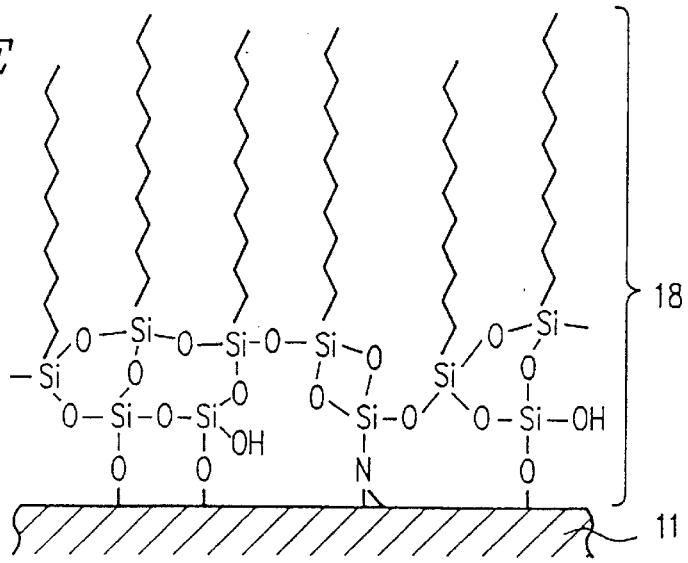

It is possible to further form a chemically adsorbed film on the surface of the substrate shown in FIG. 1D. As a result, a higher-density chemically adsorbed film 18 can be formed as shown in FIG. 1E.

Another preferred method for producing a chemically adsorbed film according to the present invention will be described with reference to FIGS. 2A to 2C. This is a method for forming a chemically adsorbed film having desired fine patterns on the surface of the substrate. For simplification, only the specific requirements for selectively producing hydrophilic groups in a desired part of the surface of the substrate will be described.

Figure 2A:
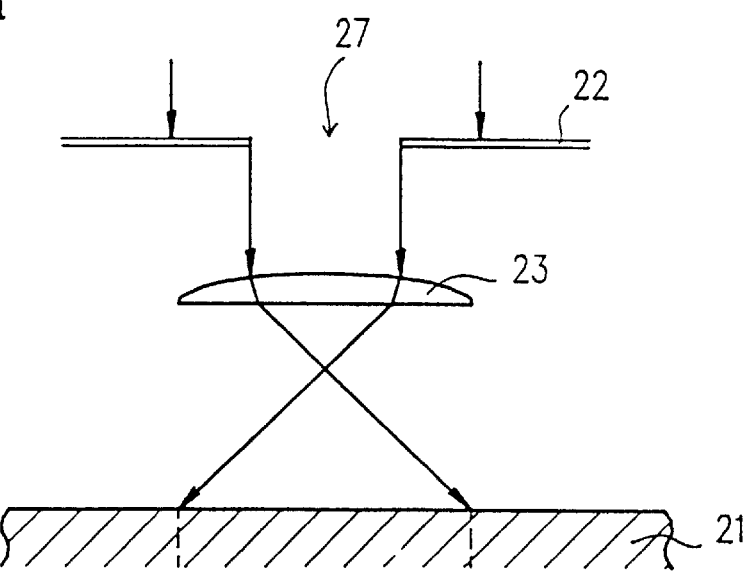

As shown in FIG. 2A, a metallic mask 22 having an opening 27 with a similar pattern to that of the desired pattern to be formed on the surface of the substrate 21 is disposed in an optical path of UV light (UV laser and/or UV light having a wavelength of 175 nm or less). The UV light passed through the opening 27 is projected onto the substrate 21 via a converging lens 23 so as to be enlarged or reduced. As a result, hydrophilic groups can be selectively produced in the desired part of the surface of the substrate 21, as shown in FIG. 2B. The UV light irradiation can be performed with the metallic mask disposed on the surface of the substrate, or the irradiation can be performed onto a surface of the substrate on which a metallic mask having a desired pattern is formed by a known method.

Figure 2B:
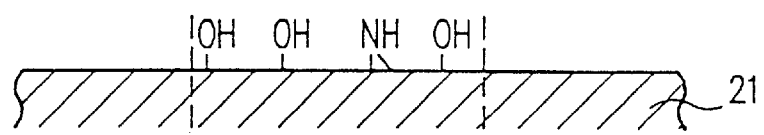
Figure 2C:
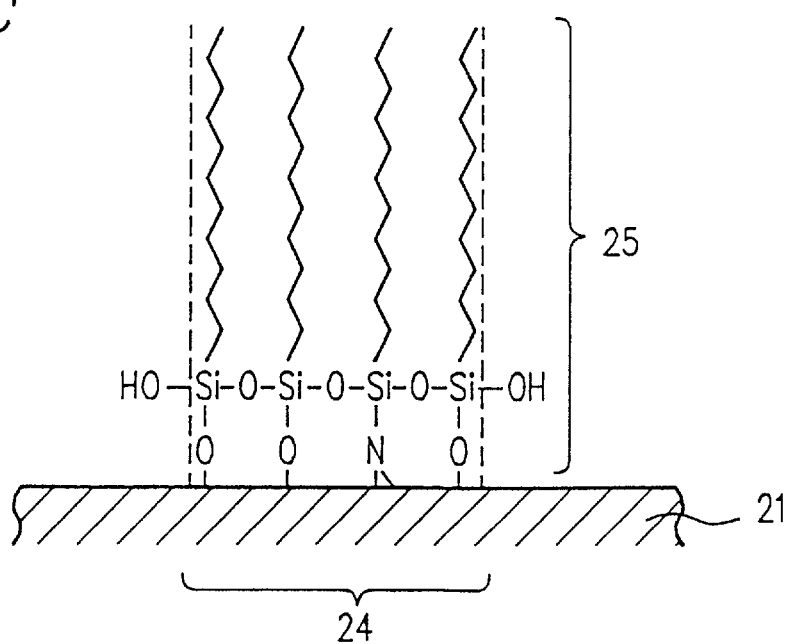

By allowing the hydrophilic groups selectively produced in the desired part of the surface of the substrate as shown in FIG. 2B to react with the chlorosilyl groups of the chlorosilane-based chemical adsorbent mentioned above, a chemically adsorbed film 25 is formed in the desired part 24 of the surface of the substrate as shown in FIG. 2C. In other words, a chemically adsorbed film having a desired fine pattern can be formed.

According to the present invention, by irradiating the surface of the substrate with UV laser and/or UV light including a wavelength of about 175 nm or less, hydrophilic groups are produced on the surface of the substrate. Based on the following mechanism, such particular UV light can produce a far larger number of hydrophilic groups on the surface of the substrate as compared with the case of irradiating commonly used UV light. (i) UV laser has a far higher fluence (or a far higher energy density) as compared with commonly used UV light (e.g., light emitted from a low-pressure mercury lamp and the like). Therefore, when the surface of the substrate is irradiated with UV laser, a large number of bonds of polymer chains on the surface of the substrate are instantaneously decomposed, so that a large number of low molecular fragments are produced and then vaporized. A large number of radicals have been produced in the portion of the surface of the substrate where the fragments have been vaporized, and these radicals react with water in the air, so that a large number of hydrophilic groups are produced. (ii) Since light with a short wavelength (i.e., UV light including a wavelength of 175 nm or less) has a high photon energy, it has an excellent ability for exciting the atoms on the surface of the substrate. For example, in the case where the substrate is irradiated in an atmosphere containing oxygen with UV light having a wavelength longer than 175 nm, oxygen is turned into ozone and then excited oxygen atoms are produced. However, in the case where the substrate is irradiated with UV light having a wavelength of 175 nm or less, the excited oxygen atoms are directly produced. In other words, the irradiation of the UV light including a wavelength of 175 nm or less instantaneously produces a large number of excited oxygen atoms. Since the excited oxygen atoms have an oxidization function (or the function of producing hydrophilic groups), a large number of hydrophilic groups are produced on the surface of the substrate irradiated with the UV light including a wavelength of 175 nm or less.

Furthermore, according to the present invention, a large number of hydrophilic groups obtained in the above-described manner and SiCl groups of the chlorosilane-based chemical adsorbent form covalent bonds, thereby forming a chemically adsorbed film. Therefore, the resulting chemically adsorbed film has a high density and is solidly bonded with the substrate. As a result, it is possible to obtain a chemically adsorbed film having excellent durability and excellent properties such as water repellency, oil repellency, anti-contaminating property and antistatic property resulting from the properties of the chemical absorptive material.

Hereinafter, the present invention will be described by way of illustrative examples with reference to accompanying drawings. It is noted that the present invention is not limited to the specific examples described below.

EXAMPLE 1

A polyimide film (product name: Kapton; manufactured by Du Pont-Toray Co., Ltd.) was used as a substrate, and the surface of the substrate was irradiated with 50 pulses of ArF laser light at an energy density of 0.5 J/cm² for every pulse irradiation. Next, the substrate irradiated with the laser light was immersed in a solution containing 1 weight % of tetra-chlorosilane (SiCl$_4$) in cyclohexane for 10 minutes. As a result, the SiCl bonds of tetrachlorosilane reacted with the hydrophilic groups on the surface of the substrate, so that the bonds represented by Formula I were formed over the entire surface of the substrate. This substrate was washed with cyclohexane and then immersed in water, so that the bonds represented by Formula II were formed and a large number of OH groups were produced on the surface of the substrate.

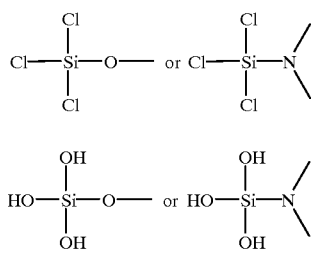

Then, a chemical adsorption solution was prepared in which a compound represented by following Formula III as a chlorosilane-based chemical adsorbent was dissolved in a mixed solvent of hexadecane and chloroform having a weight ratio of 80/20 so as to have a concentration of 1 weight %. When the substrate obtained in the above-described manner was immersed in this solution for an hour, the SiCl bonds of the compound represented by Formula III reacted with the OH groups on the surface of the substrate, so that the bonds represented by following Formula IV were formed over the entire surface of the substrate.

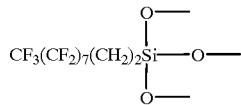

As a result, a chemically adsorbed film was formed on the surface of the polyimide film.

The water repellency of the resulting chemically adsorbed film was estimated. The estimation was conducted based on the criterion of a contact angle between the surface of the substrate and a water drop on the surface of the substrate. That is to say, the larger the contact angle is, the more satisfactory the water repellency is. The contact angle was measured using the following procedure. Under the conditions where the temperature was maintained at room temperature and the relative humidity was set to be in a range of 40 to 60%, water having a volume of 20 μl was dripped onto the surface of the substrate. The contact angle is defined as an angle formed between a tangent of a water drop and the surface of the substrate at a point where the surface of the water drop is in contact with the surface of the substrate. In this case, the contact angle is an angle on the side where the water drop is included. The contact angle was measured using an automatic contact angle meter (type CA-Z; manufactured by Kyowa Interface Science Co., Ltd.). The results are shown in following Table 1 together with the results of Examples 2 to 9 and 11 and Comparative Examples 1 and 2 to be described below.

In the following Examples and Comparative Examples, the chemically adsorbed film also contains fluorocarbon groups. Therefore, the density of the chemically adsorbed film can be estimated based on the degree of the water repellency of the film. The more satisfactory the water repellency becomes (or the larger the contact angle becomes), the higher the density of the chemically adsorbed film becomes.

TABLE 1

Measurement Results of Contact Angle (degrees)

|  | Contact angle (degree) |
| --- | --- |
| Example 1 | 123 |
| Example 2 | 112 |
| Example 3 | 124 |
| Example 4 | 118 |
| Example 5 | 122 |
| Example 6 | 117 |
| Example 7 | 120 |
| Example 8 | 120 |
| Example 10 | 119 |
| Comparative Example 1 | 58 |
| Comparative Example 2 | 66 |
| Comparative Example 3 | 55 |

Figure 3:
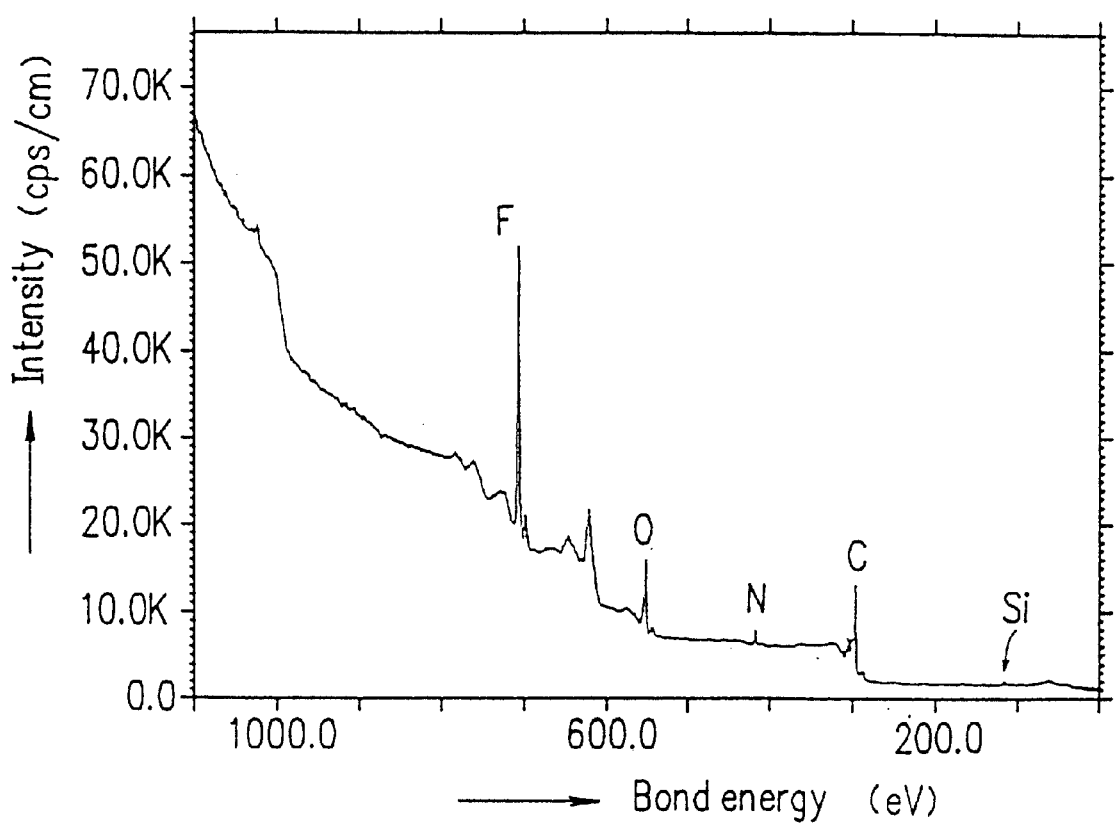
FIG. 3 is an ESCA chart of the chemically adsorbed film obtained by the production method according to the present invention.

The surface of the resulting chemically adsorbed film was analyzed by an electron spectroscopy for chemical analysis (ESCA). The ESCA chart is shown in FIG. 3, and the composition of a surface element together with the results of Comparative Example 2 to be described later are shown in following Table 2.

TABLE 2

| | Example 1 | Comparative Example 2 |
|---|---|---|
| C | 52.6 | 72.8 |
| F | 27.9 | 2.8 |
| O | 13.1 | 17.3 |
| Si | 2.9 | 0.7 |
| N | 3.5 | 6.4 |

EXAMPLE 2

A polyethyleneterephthalate film (product name: 10 Myler; manufactured by Du Pont Japan Limited) was used as a substrate, and the surface of the substrate was irradiated with 20 pulses of KrF laser light at an energy density of 1 J/cm$^2$ for every pulse irradiation. Next, a chemical adsorption solution was prepared in which the compound represented by following Formula V was dissolved as a chlorosilane-based chemical adsorbent in cyclohexane so as to have a concentration of 1 weight %. Then, the substrate irradiated with the laser light was immersed in this solution for an hour. As a result, the SiCl bonds of the compound represented by Formula V reacted with the hydrophilic groups on the surface of the substrate, so that the bonds represented by following Formula VI were formed over the entire surface of the substrate.

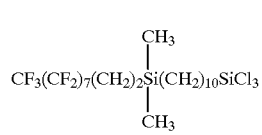

(V)

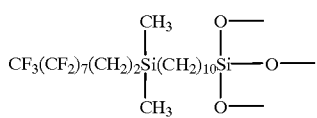

(VI)

As a result, a chemically adsorbed film was formed on the surface of the polyethyleneterephthalate film. The resulting chemically adsorbed film was subjected to the repellency estimation test. The results of the estimation are also shown in Table 1.

EXAMPLE 3

Polyethersulfone was used for a substrate, and the surface of the substrate was irradiated with 20 pulses of KrF laser light at an energy density of 0.5 J/cm$^2$ for every pulse irradiation. Next, a solution was prepared in which hexachlorodisiloxane (Cl$_3$SiOSiCl$_3$) was dissolved in a fluorine-containing solvent (e.g., Fluorinert PF-5080 (product name); manufactured by Sumitomo 3M Ltd.) so as to have a concentration of 1 weight %. Then, the substrate irradiated with the laser light was immersed in this solution for 10 minutes. As a result, the SiCl bonds of hexachlorodisiloxane reacted with the hydrophilic groups on the surface of the substrate, so that the bonds represented by following Formula VII were formed over the entire surface of the substrate. This substrate was washed with the fluorine-containing solvent and then immersed in water, so that an even larger number of OH groups were produced on the surface of the substrate as represented by following Formula VIII.

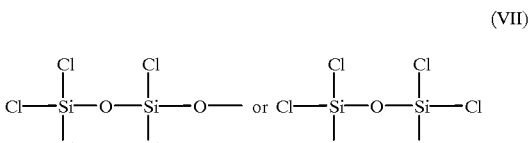

(VII)

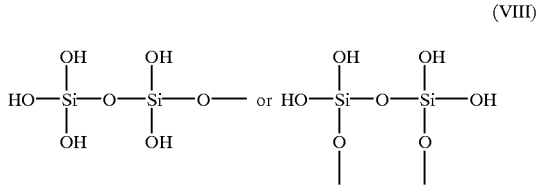

(VIII)

Then, a chemical adsorption solution was prepared in which a compound represented by Formula III was dissolved in a fluorine-containing solvent (e.g., Fluorinert FC40 (product name); manufactured by Sumitomo 3M Ltd.) so as to have a concentration of 1 weight %. When the substrate obtained in the above-described manner was immersed in this solution for an hour, the SiCl groups of the compound represented by Formula III reacted with the hydroxyl groups on the surface of the substrate, so that the bonds represented by Formula IV were formed over the entire surface of the substrate.

$$CF_3(CF_2)_7(CH_2)_2SiCl_3 \quad \text{(III)}$$

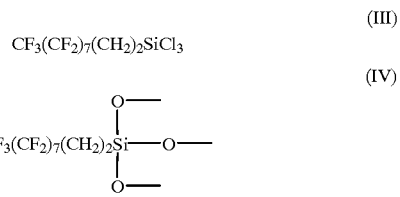

(IV)

As a result, a chemically adsorbed film was formed on the surface of the polyethersulfone substrate. The resulting chemically adsorbed film was subjected to the repellency estimation test. The results of the estimation are also shown in Table 1.

EXAMPLE 4

A chemically adsorbed film was formed in the same way as in Example 3 except that a polycarbonate substrate was used. The resulting chemically adsorbed film was subjected to the repellency estimation test. The results of the estimation are also shown in Table 1.

EXAMPLE 5

A chemically adsorbed film was formed in the same way as in Example 3 except that a polyether- etherketone substrate was used. The resulting chemically adsorbed film was subjected to the repellency estimation test. The results of the estimation are also shown in Table 1.

EXAMPLE 6

A chemically adsorbed film was formed in the same way as in Example 3 except that a polyarylate substrate was used. The resulting chemically adsorbed film was subjected to the repellency estimation test. The results of the estimation are also shown in Table 1.

EXAMPLE 7

A chemically adsorbed film was formed in the same way as in Example 3 except that a polysulfone substrate was used. The resulting chemically adsorbed film was subjected to the repellency estimation test. The results of the estimation are also shown in Table 1.

EXAMPLE 8

A chemically adsorbed film was formed in the same way as in Example 3 except that a polyetherimide substrate was used. The resulting chemically adsorbed film was subjected to the repellency estimation test. The results of the estimation are also shown in Table 1.

EXAMPLE 9

A polyimide film (product name: Kapton, manufactured by Du Pont-Toray Co., Ltd.) was used as a substrate, and a desired part of the surface of the substrate was irradiated with 50 pulses of KrF laser light at an energy density of 0.5 J/cm$^2$ for every pulse irradiation by using the metallic mask shown in FIG. 2. Then, the substrate was immersed in a cyclohexane solution containing 1 weight % of hexachlorodisiloxane for 10 minutes. As a result, the SiCl groups of hexachlorodisiloxane reacted with the hydroxyl groups on the surface of the substrate, so that the bonds represented by Formula VII were formed over the entire surface of the substrate. This substrate was washed with cyclohexane and then immersed in water, so that an even larger number of OH groups were produced on the surface of the substrate as represented by Formula VIII.

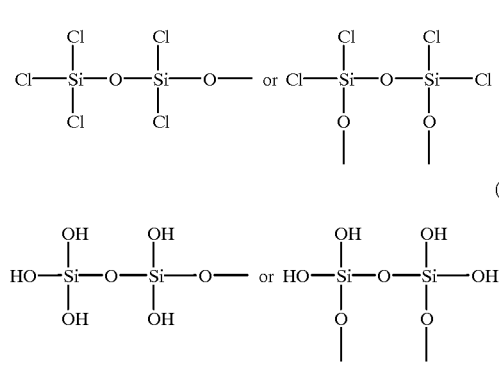

Then, a chemical adsorption solution was prepared in which the compound represented by Formula III was dissolved as a chlorosilane-based chemical adsorbent in cyclohexane so as to have a concentration of 1 weight %. When the substrate obtained in the above-described manner was immersed in this solution for an hour, the SiCl groups of the compound represented by Formula III reacted with the OH groups on the surface of the substrate, so that the bonds represented by Formula IV were selectively formed only in the part of the surface of the substrate irradiated with the laser light.

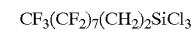

(III)

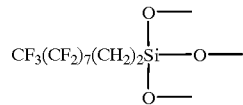

(IV)

The resulting substrate was immersed in water, and then lifted. As a result, water was repelled only by the part irradiated with the laser light. Consequently, it has been confirmed that a chemically adsorbed film with the fine pattern has been formed on the surface of the polyimide film.

EXAMPLE 10

A polyimide film (product name: Kapton; manufactured by Du Pont-Toray Co., Ltd.) was used as a substrate, and an Xe gas dielectric barrier discharge lamp (product name: UER200-172; manufactured by Ushio Inc.) was used as a light source. The substrate was disposed at a position 10 mm away from the light source, and was irradiated using the lamp for 5 minutes. Then, the irradiated substrate was immersed in a cyclohexane solution containing 1 weight % of hexachlorodisiloxane for 10 minutes. As a result, the bonds represented by Formula VII were formed. This substrate was washed with cyclohexane and then immersed in water, so that an even larger number of OH groups were produced on the surface of the substrate as represented by Formula VIII.

Then, a chemical adsorption solution was prepared in which the compound represented by Formula III was dissolved as a chlorosilane-based chemical adsorbent in cyclohexane so as to have a concentration of 1 weight %. When the substrate obtained in the above-described manner was immersed in this solution for an hour, the SiCl groups of the compound represented by Formula III reacted with the OH groups on the surface of the substrate, so that the bonds represented by Formula IV were formed.

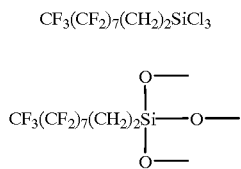

(III)

CF$_3$(CF$_2$)$_7$(CH$_2$)$_2$SiCl$_3$ (IV)

CF$_3$(CF$_2$)$_7$(CH$_2$)$_2$Si—O—
with O— below and O— to the right

As a result, a chemically adsorbed film was formed on the surface of the polyimide film. The resulting chemically adsorbed film was subjected to the repellency estimation test. The results of the estimation are also shown in Table 1.

EXAMPLE 11

A polyimide film (product name: Kapton; manufactured by Du Pont-Toray Co., Ltd.) was used as a substrate, a metallic mask was closely attached to the surf ace of the substrate, and an Xe gas dielectric barrier discharge lamp (product name: UER200-172; manufactured by Ushio Inc.) was used as a light source. The substrate was disposed at a position 10 mm away from the light source., and was irradiated using the lamp for 5 minutes. Then, the substrate irradiated with the lamp was immersed in a cyclohexane solution containing 1 weight % of tetrachlorosilane for 10 minutes. As a result, the SiCl groups of tetra-chlorosilane reacted with the hydrophilic groups on the surface of the substrate, so that the bonds represented by Formula I were formed. This substrate was washed with cyclohexane and then immersed in water, so that the bonds represented by Formula II were formed and an even larger number of OH groups were produced on the surface of the substrate.

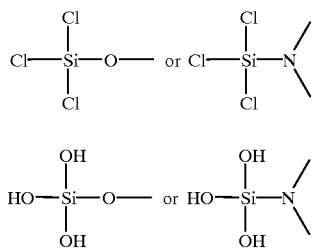

(I)

(II)

Then, a chemical adsorption solution was prepared in which the compound represented by Formula V was dissolved as a chlorosilane-based chemical adsorbent in cyclohexane so as to have a concentration of 1 weight %. When the substrate obtained in the above-described manner was immersed in this solution for an hour, the SiCl groups of the compound represented by Formula V reacted with the hydrophilic groups on the surface of the substrate, so that the bonds represented by Formula VI were selectively formed only in the part of the surface of the substrate irradiated with the light.

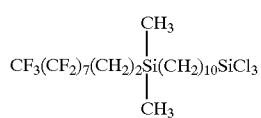

(V)

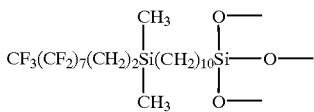

(VI)

The resulting substrate was immersed in water, and then lifted. As a result, water was repelled only by the part irradiated with the light. Consequently, it has been confirmed that a chemically adsorbed film with the fine pattern has been formed on the surface of the polyimide film.

COMPARATIVE EXAMPLE 1

A polyimide film (product name: Kapton; manufactured by Du Pont-Toray Co., Ltd.) was used as a substrate, and was immersed in a chloroform solution containing 1 weight % of tetrachlorosilane (SiCl$_4$) for 10 minutes without performing any treatment therefor. This substrate was immersed in the solution, washed with chloroform and then immersed in water. After the substrate was dried, the substrate was immersed for an hour in a solution in which the compound represented by Formula V was dissolved in cyclohexane so as to have a concentration of 1 weight %.

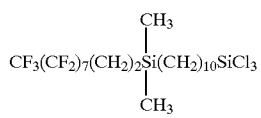

(V)

As a result, a chemically adsorbed film was formed on the surface of the polyimide film. The resulting chemically adsorbed film was subjected to the repellency estimation test. The results of the estimation are also shown in Table 1.

COMPARATIVE EXAMPLE 2

A polyimide film (product name: Kapton; manufactured by Du Pont-Toray Co., Ltd.) was used as a substrate, and was treated with an oxygen plasma. Then the substrate treated with oxygen plasma was immersed in a chloroform solution containing 1 weight % of tetrachlorosilane (SiCl$_4$) for 10 minutes. The substrate was washed with chloroform and then immersed in water. After the substrate was dried, the substrate was immersed for an hour in a solution in which the compound represented by Formula V was dissolved in cyclohexane so as to have a concentration of 1 weight %.

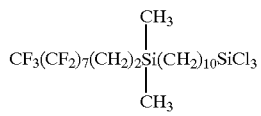

(V)

As a result, a chemically adsorbed film was formed on the surface of the polyimide film. The resulting chemically adsorbed film was subjected to the repellency estimation test. The results of the estimation are also shown in Table 1.

Figure 4:
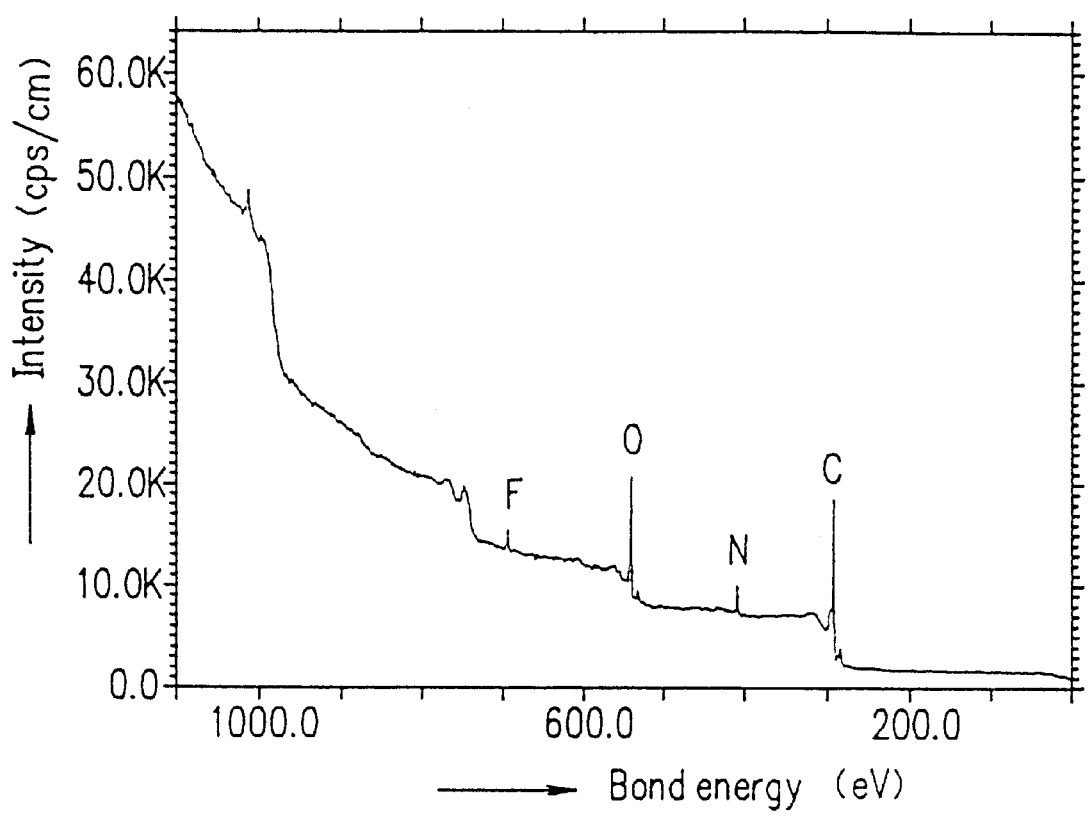
FIG. 4 is an ESCA chart of the chemically adsorbed film obtained in the comparative examples.

Furthermore, the surface of the resulting chemically adsorbed film was analyzed by an ESCA. The ESCA chart is shown in FIG. 4, and the composition of a surface element is shown in Table 2.

COMPARATIVE EXAMPLE 3

A polyimide film (product name: Kapton; manufactured by Du Pont-Toray Co., Ltd.) was used as a substrate, and was immersed for an hour in a solution in which the compound represented by Formula V was dissolved in cyclohexane so as to have a concentration of 1 weight % without performing any treatment therefor.

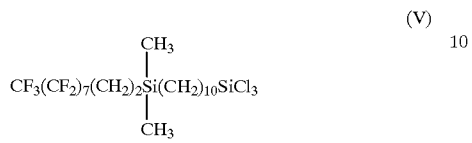

(V)

As a result, a chemically adsorbed film was formed on the surface of the polyimide film. The resulting chemically adsorbed film was subjected to the repellency estimation test. The results of the estimation are also shown in Table 1.

As shown in the results in Table 1, a far larger contact angle can be obtained in all the examples where the contact angles were measured as compared with the comparative examples. These results prove an extremely high density of a chemically adsorbed film obtained by the production method of the present invention.

Also, as is more apparent from the comparison between the ESCA analysis results obtained in Example 1 and those obtained in Comparative Example 2, the chemically adsorbed film according to the present invention has a high density. As shown in FIG. 3, in analyzing the chemically adsorbed film of Example 1, a very high spectral peak appears at an energy density specific to fluorine atoms, whereas, even in analyzing the chemically adsorbed film of Comparative Example 2, there are few spectral peaks as shown in FIG. 4, which are considerably lower than those shown in FIG. 3. In addition, as shown in the results in Table 2, in the composition of the surface element of the chemically adsorbed film of Example 1, far larger amounts of F and Si elements are contained in the film as is specific to a chemical absorptive material as compared with the results of Comparative Example 2. Therefore, the ESCA analysis results prove an extremely high density of a chemically adsorbed film obtained by the production method of the present invention.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for producing a chemically adsorbed film the steps of:
   irradiating a surface of a polymer substrate with ultraviolet laser light so as to produce a hydrophilic group on the surface of the polymer substrate; and
   contacting the surface of the polymer substrate on which the hydrophilic group is produced with a chemical adsorption solution containing a chlorosilane-containing chemical adsorbent and a nonaqueous solvent, and reacting the hydrophilic group of the polymer substrate with a chlorosilyl group of the chlorosilane-containing chemical adsorbent for forming a covalent bond, thereby forming a chemically adsorbed film on the surface of the polymer substrate,
   wherein the polymer substrate is made of a material selected from the group consisting of polyimide, polyethersulfone and polyetheretherketone,
   wherein the ultraviolet laser light is selectively irradiated onto a predetermined part of the surface of the polymer substrate.

2. The method for producing a chemically adsorbed film according to claim 1, wherein the chlorosilane-containing chemical adsorbent has a fluorocarbon group.

3. A method for producing a chemically adsorbed film comprising the steps of:
   irradiating a surface of a polymer substrate with ultraviolet light including a wavelength of about 175 nm or less so as to produce a hydrophilic group on the surface of the polymer substrate; and
   contacting the surface of the polymer substrate on which the hydrophilic group is produced with a chemical adsorption solution containing a chlorosilane-containing chemical adsorbent and a nonaqueous solvent, and reacting the hydrophilic group of the polymer substrate with a chlorosilyl group of the chlorosilane-containing chemical adsorbent for forming a covalent bond, thereby forming a chemically adsorbed film on the surface of the polymer substrate,
   wherein the polymer substrate is made of a material selected from the group consisting of polyimide, polyethersulfone and polyetheretherketone,
   wherein the ultraviolet laser light including a wavelength of about 175 nm or less is selectively irradiated onto a predetermined part of the surface of the polymer substrate.

4. The method for producing a chemically adsorbed film according to claim 3, wherein the chlorosilane-containing chemical adsorbent has a fluorocarbon group.

5. The method for producing a chemically adsorbed film according to claim 3, wherein a source of the ultraviolet light including a wavelength of about 175 nm or less is a dielectric barrier discharge lamp.

* * * * *